United States Patent
Carlson et al.

(10) Patent No.: US 9,440,812 B2
(45) Date of Patent: Sep. 13, 2016

(54) WEB LONGITUDINAL POSITION SENSOR

(75) Inventors: Daniel H. Carlson, St. Paul, MN (US);
John T. Strand, St. Paul, MN (US);
Daniel S. Wertz, St. Paul, MN (US);
Levent Biyikli, St. Paul, MN (US);
Brian K. Nelson, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 1112 days.

(21) Appl. No.: 12/522,493

(22) PCT Filed: Dec. 19, 2007

(86) PCT No.: PCT/US2007/088090
§ 371 (c)(1),
(2), (4) Date: Jul. 8, 2009

(87) PCT Pub. No.: WO2008/088650
PCT Pub. Date: Jul. 24, 2008

(65) Prior Publication Data
US 2010/0097462 A1    Apr. 22, 2010

Related U.S. Application Data

(60) Provisional application No. 60/884,494, filed on Jan. 11, 2007.

(51) Int. Cl.
*G03F 9/00* (2006.01)
*B65H 23/188* (2006.01)
(Continued)

(52) U.S. Cl.
CPC ...... *B65H 23/1882* (2013.01); *B65H 23/0216* (2013.01); *B65H 23/032* (2013.01);
(Continued)

(58) Field of Classification Search
CPC ........................................................ G03F 9/00
See application file for complete search history.

(56) References Cited

U.S. PATENT DOCUMENTS

| 1,898,723 A | 2/1933 | Fuller |
| 3,570,735 A | 3/1971 | Kurz |

(Continued)

FOREIGN PATENT DOCUMENTS

| CN | 2447719 | 9/2001 |
| DE | 197 54 776 | 6/1999 |

(Continued)

OTHER PUBLICATIONS

U.S. Appl. No. 60/944,888, filed Jun. 19, 2007 entitled "Total Internal Reflection Displacement Scale".

(Continued)

*Primary Examiner* — Mikhail Itskovich
(74) *Attorney, Agent, or Firm* — Yufeng Dong; Scott A. Baum (57) ABSTRACT

Methods and systems for determining longitudinal position of an elongated web are described. Sensors are used to detect one or more substantially continuous fiducial marks disposed longitudinally on the web. The sensors generate signals associated with the fiducial marks. A position detector receives the signals and determines a longitudinal position of the web using the sensor signals. The fiducial marks may be periodic fiducial marks, such as sine and/or cosine marks on the web and/or may be piecewise continuous marks. The coarse longitudinal position of the web can be determined based on periodically recurring features of the fiducial marks. The fine longitudinal position can be determined based on continuous portions of the fiducial marks between the periodically recurring features.

32 Claims, 6 Drawing Sheets

(51) Int. Cl.
   *B65H 23/02*     (2006.01)
   *B65H 23/032*    (2006.01)
   *G06T 7/00*      (2006.01)

(52) U.S. Cl.
   CPC ............... *G03F 9/00* (2013.01); *G06T 7/004* (2013.01); *B65H 2511/512* (2013.01); *B65H 2557/10* (2013.01); *G06T 2207/30124* (2013.01); *G06T 2207/30204* (2013.01)

(56) References Cited

U.S. PATENT DOCUMENTS

| | | | |
|---|---|---|---|
| 3,615,048 | A | 10/1971 | Martin |
| 3,667,031 | A | 5/1972 | Cox, Jr. et al. |
| 4,010,463 | A | 3/1977 | Kay |
| 4,049,213 | A | 9/1977 | Hank et al. |
| 4,274,748 | A | 6/1981 | Burtin |
| 4,284,221 | A | 8/1981 | Nagel |
| 4,401,893 | A | 8/1983 | Dehuysser |
| 4,529,922 | A | 7/1985 | Ono |
| 4,532,430 | A | 7/1985 | Ross |
| 4,610,739 | A | 9/1986 | Jensen |
| 4,618,518 | A | 10/1986 | Pricone |
| 4,697,485 | A | 10/1987 | Raney |
| 4,893,135 | A | 1/1990 | Jamzadeh |
| 4,945,252 | A | 7/1990 | Lerner et al. |
| 5,047,651 | A | 9/1991 | Wessner |
| 5,355,154 | A | 10/1994 | Guerin |
| 5,450,116 | A | 9/1995 | Weiselfish |
| 5,667,123 | A | 9/1997 | Fukuda |
| 5,768,776 | A | 6/1998 | Pendse |
| 5,778,724 | A | 7/1998 | Clapp |
| 5,859,707 | A | 1/1999 | Nakagawa |
| 5,870,204 | A | 2/1999 | Chiu |
| 5,931,097 | A * | 8/1999 | Neifert et al. ............... 101/454 |
| 6,056,180 | A | 5/2000 | Crowley |
| 6,087,655 | A | 7/2000 | Korbin |
| 6,164,201 | A | 12/2000 | Burke |
| 6,273,313 | B1 | 8/2001 | Noll et al. |
| 6,375,870 | B1 | 4/2002 | Visovsky |
| 6,396,073 | B1 | 5/2002 | Taylor |
| 6,495,214 | B1 | 12/2002 | Nentwich |
| 6,505,906 | B1 | 1/2003 | Bland et al. |
| 6,521,905 | B1 | 2/2003 | Luxem |
| 6,647,128 | B1 | 11/2003 | Rhoads |
| 7,121,496 | B2 | 10/2006 | Jackson |
| 7,174,237 | B2 | 2/2007 | Takayama |
| 7,296,717 | B2 | 11/2007 | Swanson et al. |
| 7,526,230 | B2 | 4/2009 | Kudo |
| 7,560,718 | B2 | 7/2009 | Wittmann |
| 7,826,041 | B2 | 11/2010 | Takeda |
| 2002/0018220 | A1 | 2/2002 | Aoki |
| 2002/0121131 | A1 | 9/2002 | Mancevski |
| 2002/0122186 | A1 | 9/2002 | Igaki |
| 2003/0218125 | A1 | 11/2003 | Igaki |
| 2004/0022557 | A1 | 2/2004 | Kudo |
| 2004/0197443 | A1 | 10/2004 | Scarabelli et al. |
| 2004/0227644 | A1 * | 11/2004 | Lin et al. ................... 340/870.3 |
| 2004/0240513 | A1 | 12/2004 | del Puerto |
| 2004/0262505 | A1 | 12/2004 | Atsuta |
| 2005/0218237 | A1 * | 10/2005 | Lapstun et al. ................ 235/494 |
| 2005/0232475 | A1 | 10/2005 | Floeder et al. |
| 2005/0263689 | A1 | 12/2005 | Atsuta |
| 2005/0274880 | A1 | 12/2005 | Atsuta |
| 2006/0174992 | A1 | 8/2006 | Brost |
| 2006/0210714 | A1 | 9/2006 | Huizinga et al. |
| 2007/0099396 | A1 | 5/2007 | Hirai |
| 2007/0138153 | A1 | 6/2007 | Redman |
| 2008/0039718 | A1 | 2/2008 | Drinan |
| 2008/0073493 | A1 | 3/2008 | Atsuta |

FOREIGN PATENT DOCUMENTS

| | | |
|---|---|---|
| EP | 0 043 723 | 1/1982 |
| EP | 0 838 665 | 4/1998 |
| EP | 1 235 054 | 8/2002 |
| EP | 1 722 021 | 11/2006 |
| GB | 2 065 871 | 7/1981 |
| GB | 2 195 179 | 3/1988 |
| JP | 57-057158 | 4/1982 |
| JP | 62-111860 | 5/1987 |
| JP | 02-037963 | 8/1990 |
| JP | 05-010725 | 1/1993 |
| JP | 11-167165 A | 6/1999 |
| JP | 2005-178962 | 7/2005 |
| WO | 2005/106104 | 11/2005 |
| WO | WO 2006/107057 | 10/2006 |
| WO | WO 2007/027757 | 3/2007 |

OTHER PUBLICATIONS

U.S. Appl. No. 60/944,890, filed Jun. 19, 2007 entitled "Systems and Methods for Fabricating Displacement Scales".

U.S. Appl. No. 60/944,882, filed Jun. 19, 2007, entitled "Systems and Methods for Indicating the Position of a Web".

U.S. Appl. No. 61/141,128, filed Dec. 29, 2008, entitled "Phase-locked Web Position Signal Using Web Fiducials".

U.S. Appl. No. 61/141,308, filed Dec. 30, 2008, entitled "Apparatus and Method for Making Fiducials on a Substrate".

* cited by examiner

WEB LONGITUDINAL POSITION SENSOR

TECHNICAL FIELD

The present disclosure is related to methods and systems for determining longitudinal position of an elongated web.

BACKGROUND

Fabrication of many articles, including flexible electronic or optical components, involves registration between layers of material deposited or formed on an elongated substrate or web. The formation of the material layers on the web may occur in a continuous process or a step and repeat process involving multiple steps. For example, patterns of material may be deposited in layers on an elongated web through multiple deposition steps to form layered electronic or optical devices. Other articles require precise registration of features that are applied on one or both sides of the web.

To achieve accurate registration between the layers, lateral crossweb positioning and longitudinal downweb positioning must be maintained as the web moves through multiple manufacturing steps. Maintaining registration between layers formed on the web becomes more complex when the web is flexible or stretchable. Some articles will have multiple passes (or stages) that apply material or processes applied to the web that require precise position registration between the process steps.

SUMMARY

Embodiments of the present disclosure involve methods and systems for determining the longitudinal position of an elongated web. One embodiment is directed to a method for determining web position. One or more substantially continuous fiducial marks disposed longitudinally on the web are sensed. The longitudinal position of the web is determined based on the fiducial marks. The method may further include compensating for lateral movement of the web to enhance accuracy of the longitudinal position determination.

In some implementations, the fiducial marks comprise one or more substantially continuous periodic marks disposed longitudinally on the web. For example a single sinusoidal mark may be used or a sine mark and a cosine mark may be used together.

In some implementations, the fiducial marks may comprise one or more piecewise continuous marks. For example, the fiducial marks generally include regions having finite, nonzero slope relative to the longitudinal axis of the web.

In one approach involving the use of one or more periodic fiducial marks, the longitudinal position of the web may be based on periodically recurring features of the periodic fiducial marks. For example, a coarse longitudinal position of the web may be determined by sensing and counting the periodically recurring features. A fine longitudinal position may be determined based on the substantially continuous portions of the fiducial marks between the periodically recurring features. If sine and/or cosine marks are used, the periodically recurring features may be zero crossings or peaks of the sine or cosine marks.

In some configurations, a lateral position of the web may be determined based on the longitudinal fiducial marks or based on a lateral position reference. The lateral position reference may be a mark on the web, the web edge, or other reference for lateral positioning.

Sensing the fiducial marks involves detecting the fiducial marks on the web and generating sensor signals corresponding to the fiducial marks. The sensor signals may be processed by techniques including level shifting, filtering, angle adjustment, and/or other processing techniques to improve the signal to noise ratio prior to use in position determination. In one approach involving the use of sine and cosine fiducial marks, sensor signals are generated corresponding to the sine and cosine marks. The arctan 2 function of the sine and cosine values is calculated yielding an angle that is related to the longitudinal position of the web and preserves the quadrant information. The longitudinal position is determined based on the angle and quadrant information obtained from the arctan 2 calculation.

According to one implementation, longitudinal movement of the web is controlled based on the longitudinal position determined through the use of the substantially continuous fiducial marks.

Another embodiment of the disclosure is directed to an apparatus for determining a position of an elongated web. The apparatus includes one or more sensors configured to sense one or more substantially continuous fiducial marks disposed in a longitudinal direction on the web. The sensors are configured to generate signals associated with the fiducial marks. A position detector receives the signals and determines a longitudinal position of the web using the sensor signals. The position detector may compensate for lateral web movement to enhance the longitudinal position determination.

In some implementations, the web is flexible or stretchable. The web may comprise a paper, fiber, woven or nonwoven material. In some embodiments, the web comprises a polymeric web of polyester, PET, or polycarbonate. The fiducial marks may be made by printing, scribing, laser ablation, cutting the web, forming voids in the web, embossing, casting, coating or by any other method that produces a detectable mark on the web.

The sensors may comprise optical, electromagnetic, contact, and/or other types of sensors. In one approach, a camera is used to sense the fiducial marks. The signals generated by the sensors may undergo processing prior to use in position determination. For example, the sensor signals may be processed using a recursive filter such as a Kalman filter.

The apparatus may further include a control unit configured to control longitudinal movement of the web based on the longitudinal position determined by the position detector. In certain configurations, the position detector is further configured to determine lateral web position. The lateral web position may be determined based on the longitudinal fiducial marks or a lateral position reference such as a lateral fiducial mark on the web, or a web edge. Sensing the lateral fiducial mark or web edge may be accomplished using a lateral position sensor, for example, If lateral position is determined, the control unit may control the lateral web movement based on lateral position.

The above summary of the present disclosure is not intended to describe each embodiment or every implementation of the present disclosure. Advantages and attainments, together with a more complete understanding of the disclosure, will become apparent and appreciated by referring to the following detailed description and claims taken in conjunction with the accompanying drawings.

While the disclosure is amenable to various modifications and alternative forms, specifics thereof have been shown by way of example in the drawings and will be described in detail. It is to be understood, however, that the intention is not to limit the disclosure to the particular embodiments described. On the contrary, the intention is to cover all modifications, equivalents, and alternatives falling within the scope of the invention as defined by the appended claims.

DETAILED DESCRIPTION

In the following description of the illustrated embodiments, reference is made to the accompanying drawings which form a part hereof, and in which is shown by way of illustration, various embodiments in which the disclosure may be practiced. It is to be understood that the embodiments may be utilized and structural changes may be made without departing from the scope of the present disclosure.

There is a need for enhanced methods and systems that determine the position of an elongated web used as a substrate in a manufacturing process. The present disclosure fulfills these and other needs, and offers other advantages over the prior art.

Embodiments of the present disclosure illustrate methods and systems for determining the longitudinal position of a web based on continuous fiducial markings disposed longitudinally on the web. Determination of the position of an elongated web allows alignment of the web during successive processing steps. For example, embodiments of the disclosure may be used to facilitate alignment between multiple layers of material deposited on a web during a roll to roll manufacturing process. The processes described herein are particularly useful for aligning the layers of multi-layer electronic devices formed on a web. Approaches using discrete fiducial marks disposed on the web to determine the longitudinal web position only provide periodic position detection and do not provide position information during intervals between the discrete marks. The fiducial marks illustrated by the various embodiments discussed herein may be used to provide continuous longitudinal position updates and more accurate web positioning.

The approaches of the present disclosure automatically compensate for changes in web strain that commonly occur in web processing applications. As web strain is increased (i.e. the web is stretched more) the longitudinal web fiducials are stretched along with corresponding elements or features formed on the web. This allows the web fiducials to be used to accurately track the position of elements deposited on the web. For example, the fiducials may be deposited on the web substantially simultaneously with a layer of web elements. As the fiducials and the web elements are deposited, the elements deposited on the web and the fiducials experience the same amount of web strain. The fiducials may be used to accurately track the position of the web elements, regardless of the amount of web strain in subsequent processes. Using the approaches described herein, accurate registration to web elements can be achieved even when the web is stretched.

FIGS. 1A-1F illustrate fiducial marks of various configurations in accordance with embodiments of the disclosure. The fiducial marks are substantially continuous or piecewise continuous and are disposed along the longitudinal axis of the web such as along a web edge. The fiducial marks generally have regions where the slope of the marks is finite and non-zero relative to the longitudinal axis of the web.

The fiducial marks may be non-periodic or periodic functions with respect to the web longitudinal axis, for example. As described in more detail below, periodic fiducial marks may be used to determine both coarse and fine position of the web. The combination of coarse and fine position information provides high resolution position measurement over a large distance.

In some embodiments, a single substantially continuous fiducial mark may be used to determine longitudinal position. A single substantially continuous fiducial mark is illustrated as a sinusoidal mark 101 disposed along the longitudinal axis 102 of the web 100 in FIG. 1A. In other embodiments, two sinusoidal marks are used, as illustrated by the sine 101 and cosine 103 marks of FIG. 1B. Use of two substantially continuous fiducial marks such as the sine 101 and cosine 103 marks provides redundant information yielding substantially higher noise immunity, accuracy, and resolution than a single mark.

Figure 1A:
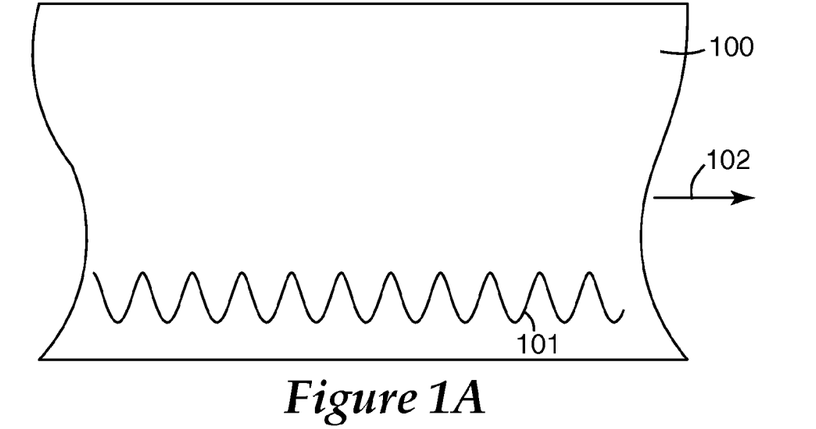
FIGS. 1A-1F show various configurations of substantially continuous fiducial marks disposed longitudinally on an elongated web in accordance with embodiments of the disclosure.
Figure 1B:
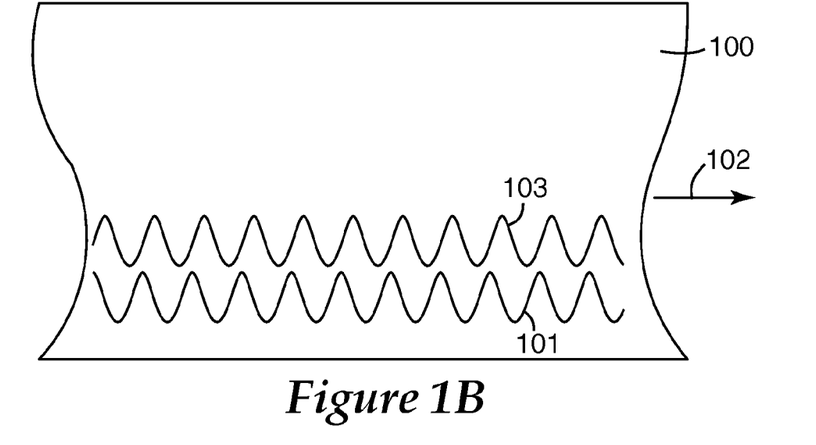
Figure 1C:
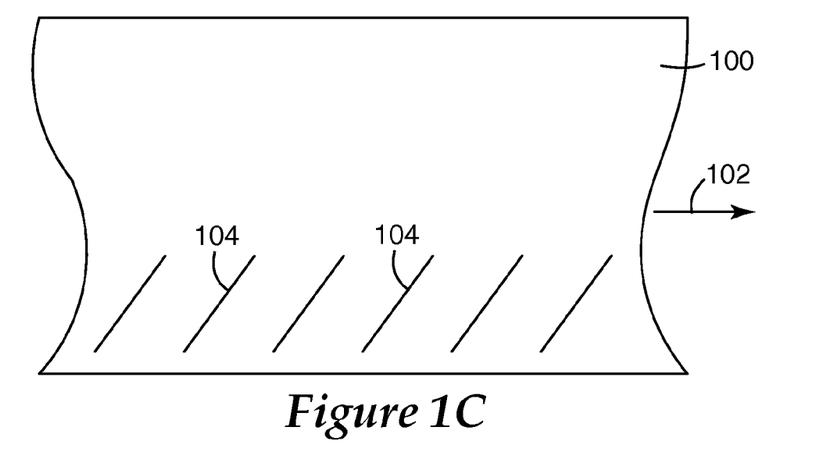
Figure 1D:
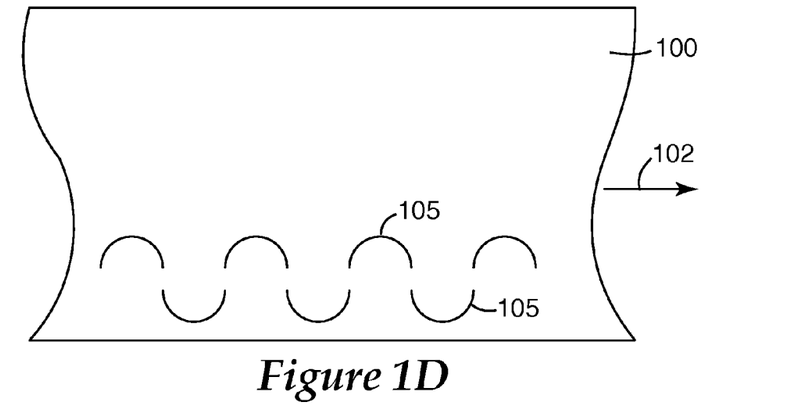

In some embodiments, the fiducial marks may comprises piecewise continuous marks as illustrated in FIG. 1C. Piecewise continuous marks are particularly useful for fiducial marking methods that produce voids in the web where continuous marks would cut off a portion of the web. The fiducial marks illustrated in FIG. 1C comprise a series of diagonal lines 104 having finite, non-zero slope with respect to the web longitudinal axis 102. Non-linear, piecewise continuous patterns are also possible as illustrated by the non-linear piecewise continuous fiducial marks 105 of FIG. 1D.

Substantially continuous fiducial marks such as those illustrated in FIGS. 1A-1D may be used to track the longitudinal position of the web in systems where lateral shifts in web position are negligible and/or lateral position of the web is maintained over the longitudinal distance tracked. In systems where the lateral position of the web is non-negligible, lateral web motion may be controlled to more accurately determine longitudinal distance. In some embodiments, lateral web motion may be detected and taken into account during determination of longitudinal distance.

Figure 1E:
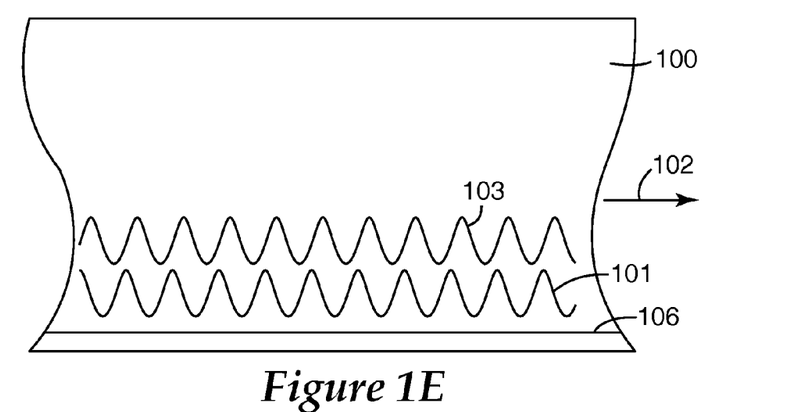
Figure 1F:
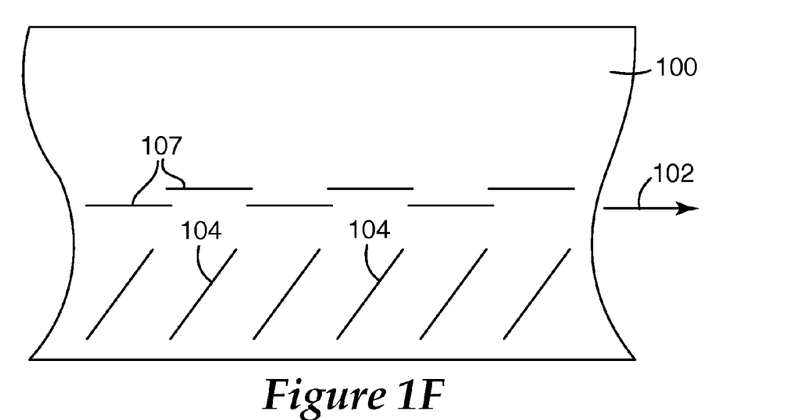

In some implementations, lateral web motion is determined using the web edge or fiducial marks disposed on the web. For example, a web edge or horizontal line disposed on the web may provide lateral position information. The lateral position reference may be used in addition to the one or more continuous fiducial marks that provide longitudinal position information. FIG. 1E illustrates a horizontal line 106 disposed on the web 100 that may be used for lateral position sensing in addition to sine 101 and cosine 103 marks used for longitudinal position sensing in accordance with one embodiment. FIG. 1F illustrates a series horizontal lines 107 for sensing lateral position and a series of diagonal lines 104 for sensing longitudinal position in accordance with one embodiment. The configuration illustrated in FIG. 1F is particularly useful for fiducial marking methods that produce voids in the web such as cutting the web or laser ablation of the web.

The fiducial marks comprise patterns made on the web or applied to the web. In optical configurations, the fiducial marks modulate either transmitted or reflected light.

The marks may be made or applied to the web by contact direct printing, ink jet printing, laser printing, laser marking, ablation, microreplication, scribing, embossing, casting, coating and/or other methods.

Figure 2A:
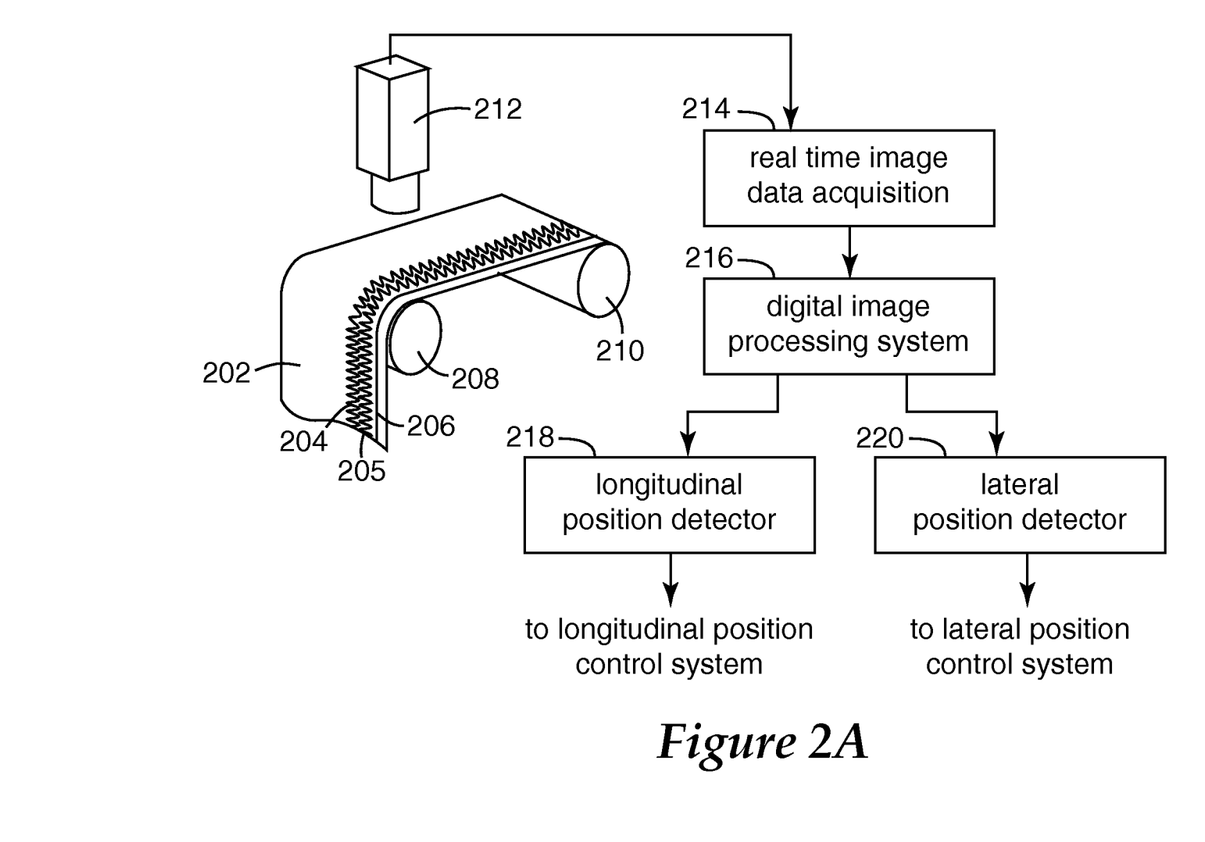
FIG. 2A is a block diagram of a web position detector configured to determine the longitudinal and lateral position of a web in accordance with embodiments of the disclosure.

FIG. 2A is a block diagram of a web position detector configured to determine the longitudinal and lateral position of a web in accordance with embodiments of the disclosure. In this embodiment, a single sensor 212 is used to sense both longitudinal and lateral fiducial marks 204-206. In other configurations, a first sensor is used to sense a lateral fiducial and a second sensor is used to sense a longitudinal fiducial mark.

As illustrated in FIG. 2A, the web 202 includes longitudinal fiducial marks comprising sine and cosine marks 204, 205. The web 202 also has a lateral fiducial mark comprising a horizontal mark 206. As the web 202 passes between a rollers 208, 210, the sensor 212 senses both the longitudinal fiducial marks 204, 205 and the lateral fiducial mark 206. The sensor 212 may be camera or other type of optical sensor, an electromagnetic sensor, a density sensor, a contact sensor, or any other type of sensor capable of sensing a fiducial mark. In the embodiment illustrated in FIG. 2A, the sensor comprises a CCD camera.

The output of the camera 212 is directed to image data acquisition circuitry 214 that acquires and digitizes the image of the fiducial marks 204-206 from the camera 212. The digital image of the fiducial marks from the image data acquisition circuitry 214 is directed to a digital image processing system 216. The digital image processing system 216 analyzes the image to generate signals corresponding to the sensed fiducial marks. The signals generated by the digital image processing system 216 may be output to a longitudinal position detector 218 and optionally to a lateral position detector 220. Information from the lateral web position detector 220 may be used by the longitudinal web position detector 218 to enhance interpolation of the longitudinal web position. The longitudinal and lateral position determined by the longitudinal web position detector 218 and the lateral web position detector 220, respectively, may be output to a movement control system configured to control the longitudinal and lateral position of the web. Using substantially continuous fiducial marks for longitudinal web positioning, the position of the web may be determined to an accuracy of better than 1 micron. The accuracy and resolution are determined by several factors. One factor is the level of contrast in the fiducial marks produced by the marking process and available to the sensor. The higher the contrast, the greater resolution that will be possible. Another factor affecting accuracy and resolution is how small the repetitive cycle (period) can be made. Yet another factor affecting accuracy and resolution is the resolution of the sensor. For example, with a sinusoid fiducial having a 1 mm period and 12 bit sensor resolution, a resolution of about 0.25 microns or even about 0.1 micron is attainable.

Figure 2B:
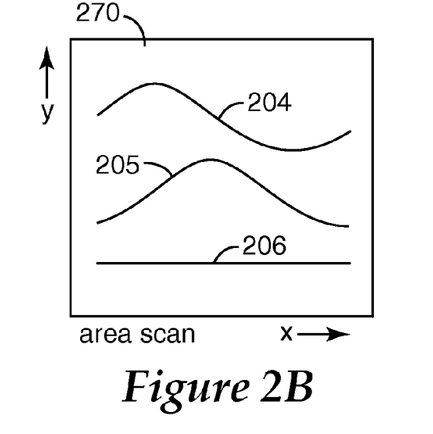
FIG. 2B illustrates an example of an image view of an area sensor that may be used to sense fiducial marks in accordance with embodiments of the disclosure.
Figure 2C:
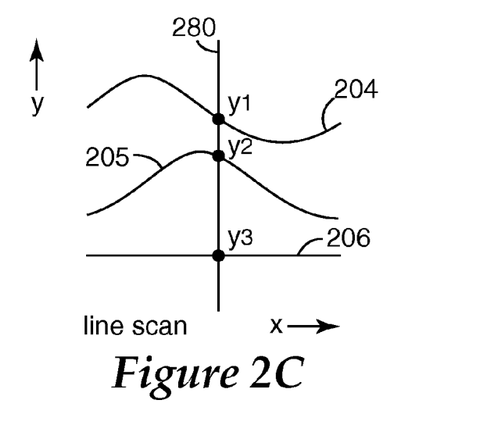
FIG. 2C illustrates an example of an image view of a line scan sensor that may be used to sense fiducial marks in accordance with embodiments of the disclosure.
Figure 2D:
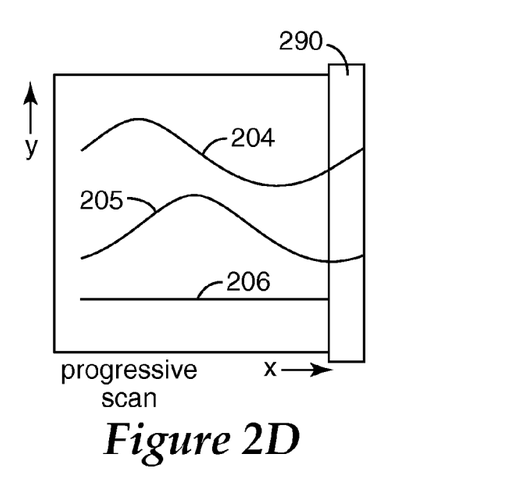
FIG. 2D shows the image view of a progressive scan sensor that may be used to sense fiducial marks in accordance with embodiments of the disclosure.

FIGS. 2B-2D illustrate an examples of the image field of various types of sensors. FIG. 2B shows fiducial marks 204, 205, 206 within the image field 270 of an area sensor. The area sensor outputs an $X_i$ by $Y_j$ array of values that represent the light intensity of each pixel location. An area sensor provides a large amount of data for signal processing. The large data set allows comparison of the current view with the last view and more sophisticated filtering of the data leading to possible advantages in position accuracy, for example. Area sensors provide a slower position update rate when compared to some other types of sensors due to the time it takes to acquire and process the relatively larger data set.

FIG. 2C shows fiducial marks 204, 205, 206 within the image field 280 of a line scan sensor. The line scan sensor outputs a 1 by $Y_n$ vector of pixel intensity. The line scan sensor provides rapid position updates when compared to the area sensor, but data storage of the position history is required.

In FIG. 2D, fiducial marks 204, 205, 206 are shown within the image field 290 of a progressive scan sensor. Generally area scan sensors allow the user to select the number of lines to scan, e.g., $X_n=4$ or other number. The progressive scan sensor provides more data for signal processing than the line scan, but is slower.

The sine and cosine marks 204, 205 may be scaled to achieve maximum resolution. For example, the amplitudes of the marks may be made as large as possible to maximize the marks 204, 205 within the image view 270, 280, 290 of the sensor, with some margin to allow for lateral position errors. The longitudinal scaling may be selected based on expected speed of operation. Using a sharper pitch of the sine and cosine marks 204, 205 (higher frequency and smaller peak to peak distance) provides steeper slopes, and more resolution in the longitudinal direction. An excessively high pitch can reduce signal to noise ratio and also increases the required sampling rate. The minimum sampling rate requires that no more than ½ cycle passes between samples. However, operation is enhanced when a sampling rate at least 3 to 4 times the minimum sampling rate is used. The achievable sampling rate varies with the type of sensor used, but rates in excess of 1 kHz are possible with camera sensors.

Figure 3:
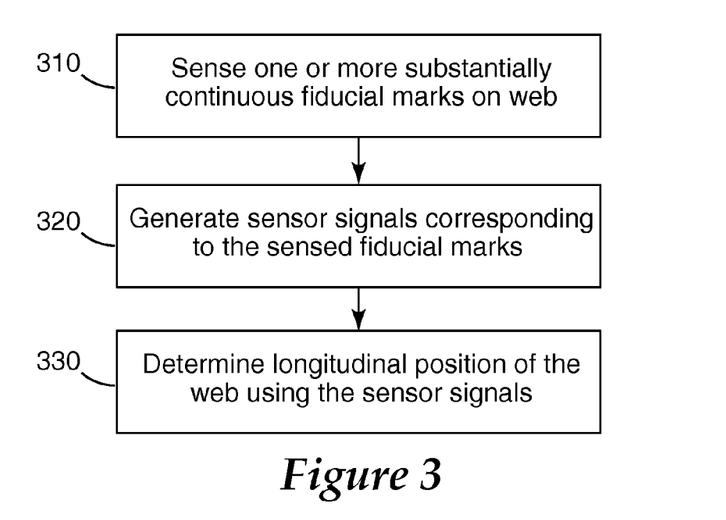
FIG. 3 is a diagram illustrating a method for determining longitudinal web position in accordance with embodiments of the disclosure.

The diagram of FIG. 3 illustrates a method for determining longitudinal web position in accordance with embodiments of the disclosure. The method involves sensing 310 one or more substantially continuous fiducial marks disposed longitudinally on a web. Sensor signals corresponding to the sensed fiducial marks are generated 320. The longitudinal position of the web is determined 330 using the sensor signals.

Periodic fiducial marks, such as sine and/or cosine marks contain information that may be used to determine coarse and fine position of the web. The coarse position may be determined from periodically recurring features of the periodic fiducial marks. In the case of sine or cosine fiducial marks, the periodically recurring features used to determine coarse longitudinal position of the web may include peaks or zero crossings, for example.

Figure 4:
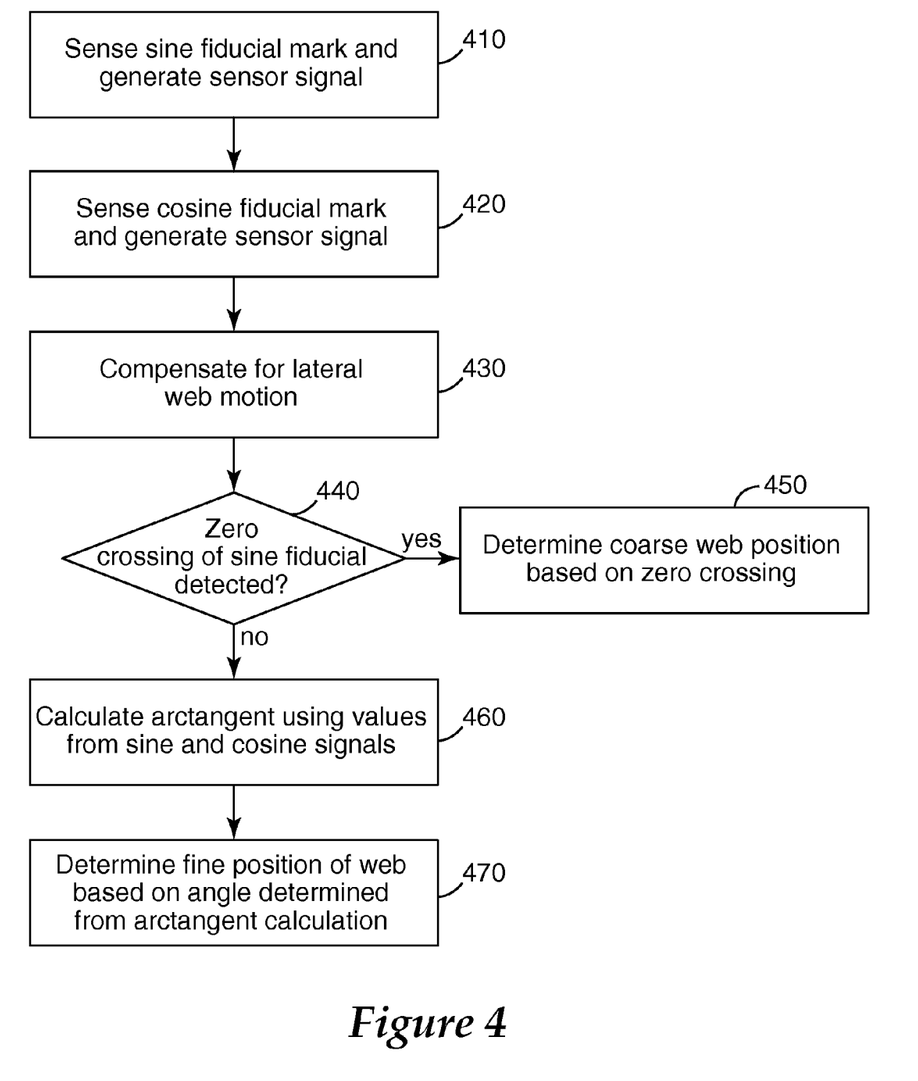
FIG. 4 is a diagram illustrating a method of determining coarse and fine position of a web using sine and cosine fiducial markings in accordance with embodiments of the disclosure.

In one embodiment using sine and cosine fiducial marks, zero crossings of each cycle are counted to determine coarse position. By taking the arctan 2 function, with proper sign handling of the sine and cosine signals, the fine position within any cycle may be determined. The diagram of FIG.

4 illustrates a method for determining longitudinal web position using coarse and fine positioning available from sine and cosine fiducial marks. Sine and cosine marks disposed on the web are sensed and sensor signals are generated 410, 420 corresponding to the sine and cosine marks. The method includes some process to compensate 430 for lateral web movement. For example, lateral web motion may be tracked using a lateral fiducial reference, such as a fiducial mark or web edge. Through the use of a lateral reference, the web may be accurately positioned within the sensor window. Alternatively, a running min-max detector with a duration of about 3 cycles may be used. Because the peak to peak amplitude of the sine and cosine signals is fixed, lateral motion of the web can be determined by noting the changes in the maximum and minimum peak value of each sine and cosine value. A change in both the maximum peak and the minimum peak in fixed relation to each other indicates a shift in the lateral position of the web. Direct sensing of a lateral fiducial is preferred as it reduces both signal processing complexity as well as reduces the lag time of the measurement. A web edge may also be used for determining lateral movement.

The sine and cosine signals are digitized and may be filtered or otherwise processed. The system searches 440 for a zero crossing of the sine mark. When the zero crossing is located, the zero crossing is counted and the coarse web position is determined 450. The arctan 2 function of the sine and cosine signal values is calculated 460. The angle and quadrant determined from the arctan 2 calculation provides 460 the fine position of the web referenced from the closest zero crossing.

Figure 5:
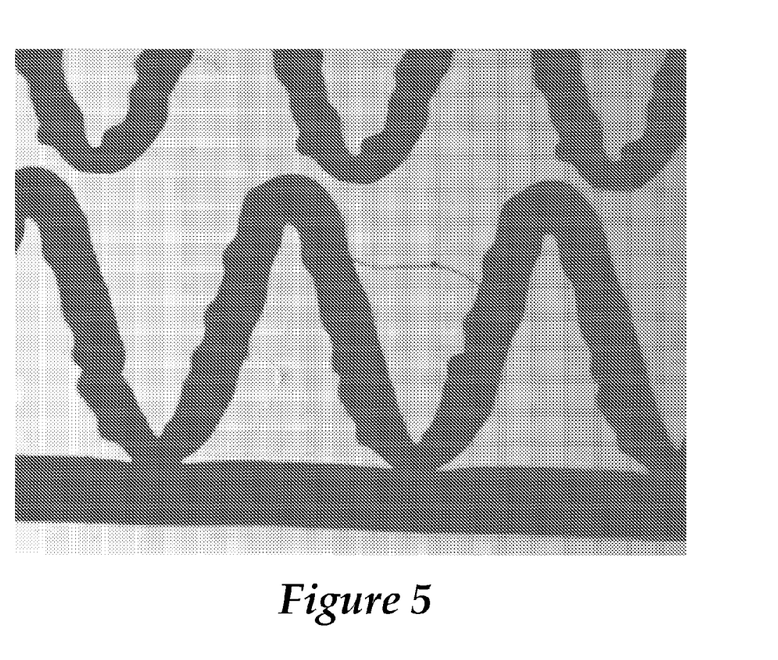
FIG. 5 is a photograph of fiducial marks that have been printed via ink jet on a polyester web in accordance with embodiments of the disclosure.

The photograph of FIG. 5 shows fiducial marks that have been printed via ink jet on a polyester web. As can be seen in FIG. 5, the ink jet printing process produces some distortion in the marks. Individual dots from the printing process can be seen and short term cyclic error from the plot engine is also visible. Imperfections in the fiducial marks may be compensated through various signal processing techniques. For example, the sensor signals generated in response to the marks may be level shifted, filtered, and/or angle adjusted to improve the signal to noise ratio.

Figure 6:
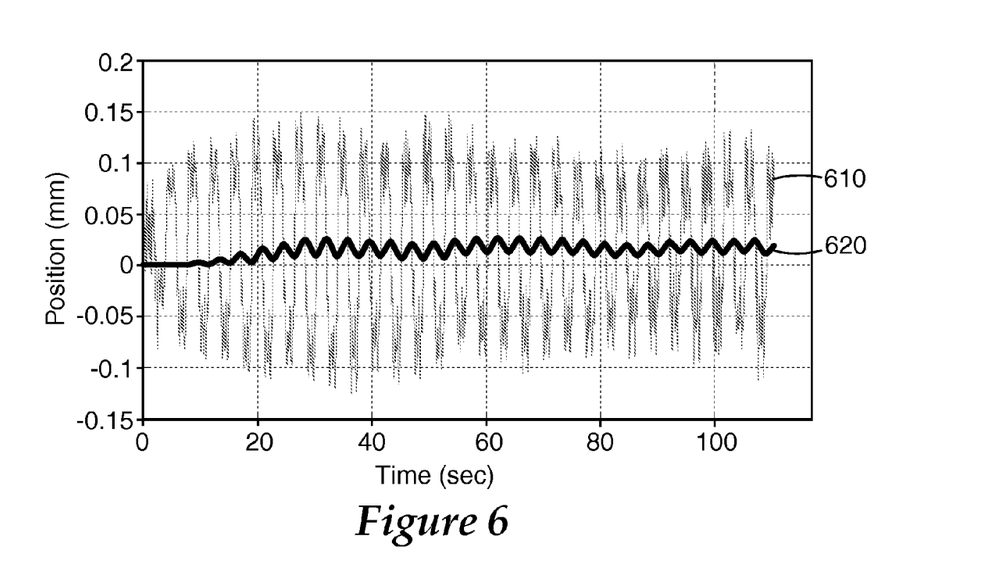
FIG. 6 illustrates the estimated longitudinal position of a web based on noisy data before and after Kalman filtering in accordance with embodiments of the disclosure.

In some embodiments, improvements in the sensor signals may be achieved by linear or non-linear filtering. For example, if a current web speed is known or estimated, bounds can be placed on the next estimated position update. Any value outside these bounds may be assumed to be noise. In particular, recursive filtering, such as through the use of a Kalman filter, may be used to improve the estimated web position. A Kalman filter uses two or more sources of information and combines them to form the best estimated value based on knowledge of the signals' statistics. The statistics may be generated in real time, or for stationary processes may be generated offline to reduce the computational burden. FIG. 6 shows graphs illustrating the estimated position based on noisy inkjet data before 610 and after 620 Kalman filtering. As can be seen in FIG. 6, there is a large cyclic error in the unfiltered signal 610 which is substantially reduced after Kalman filtering is applied 620.

The embodiments described herein involving continuous fiducial marks provide for continuous tracking of the longitudinal position of a moving web. Simple approaches may be used to apply the web fiducials to general purpose webs such as webs made of paper, fiber, woven or nonwoven material. The webs may comprise polyester, polycarbonate, PET, or other polymeric webs. The redundancy available through the use of sine and cosine marks provides high noise immunity and allows accurate web positioning. The approaches are particularly useful when used in conjunction with flexible webs.

The foregoing description of the various embodiments of the disclosure has been presented for the purposes of illustration and description. It is not intended to be exhaustive or to limit the disclosure to the precise form disclosed. Many modifications and variations are possible in light of the above teaching. It is intended that the scope of the invention be limited not by this detailed description, but rather by the claims appended hereto.

What is claimed is:

1. A method to determine the position of an elongated web, comprising:
   sensing one or more continuous fiducial marks disposed longitudinally on at least a portion of the web, wherein sensing the one or more continuous fiducial marks comprises sensing a sine fiducial mark and a cosine fiducial mark disposed longitudinally and deposited on the web; and
   determining a longitudinal position of the web based on the fiducial marks.

2. The method of claim 1, further comprising compensating for lateral movement of the web.

3. The method of claim 1, wherein:
   sensing the one or more continuous fiducial marks comprises sensing one or more periodic fiducial marks; and
   determining the longitudinal position of the web comprises:
      determining a coarse longitudinal position based on periodically recurring features of the one or more periodic fiducial marks; and
      determining a fine longitudinal position based on portions of the one or more periodic fiducial marks between the periodically recurring features.

4. The method of claim 3, wherein:
   the one or more periodic fiducial marks comprise the sine and the cosine fiducial marks; and
   the periodically recurring features comprise zero crossings of the site or the cosine fiducial marks.

5. The method of claim 3, wherein:
   the one or more periodic fiducial marks comprise the sine and the cosine fiducial marks; and
   the periodically recurring features comprise peaks of the sine or the cosine fiducial marks.

6. The method of claim 1, further comprising determining a lateral position of the web based on the longitudinal fiducial marks or a lateral position reference.

7. The method of claim 6, wherein the lateral position reference comprises a lateral fiducial mark disposed on the web.

8. The method of claim 6, wherein the lateral position reference comprises a web edge.

9. The method of claim 1, wherein:
   sensing the one or more fiducial marks comprises:
      generating signals corresponding to the fiducial marks; and
      filtering the signals; and
   determining the longitudinal position of the web based on the fiducial marks comprises determining the longitudinal position of the web using the filtered signals.

10. The method of claim 1, wherein:
    sensing the one or more fiducial marks comprises:
       sensing the sine fiducial mark and the cosine fiducial mark; and
       generating signals corresponding to the sine fiducial mark and the cosine fiducial mark; and determining the longitudinal position of the web comprises calculating an arctan 2 function of the sine and cosine signals.

11. The method of claim 1, further comprising controlling longitudinal movement of the web based on the longitudinal position.

12. An apparatus for determining a position of an elongated web having a continuous sine fiducial mark and a continuous cosine fiducial mark disposed in a longitudinal direction and deposited on at least a portion of the elongated web, the apparatus configured for use with such an elongated web and comprising:
   one or more sensors configured to sense both the sine fiducial mark and the cosine fiducial mark, the one or more sensors configured to generate signals corresponding to the fiducial marks; and
   a position detector configured to receive the sensor signals and to determine a longitudinal position of the web using the sensor signals.

13. The apparatus of claim 12, wherein the elongated web comprises a flexible web.

14. The apparatus of claim 12, wherein the elongated web comprises a polymeric web.

15. The apparatus of claim 12, wherein the elongated web comprises a paper, fiber, woven or nonwoven material.

16. The apparatus of claim 12, wherein the sine fiducial mark and the cosine fiducial mark are deposited along with a layer of elements on the elongated web.

17. The apparatus of claim 12, wherein the one or more sensors comprise one or more optical sensors.

18. The apparatus of claim 12, wherein the one or more sensors comprise one or more cameras.

19. The apparatus of claim 12, wherein:
   the position detector is configured to determine a coarse longitudinal position of the elongated web based on periodically recurring features of the sine or cosine fiducial marks and to determine a fine longitudinal position of the elongated web based on portions of the fiducial marks between the periodically recurring features.

20. The apparatus of claim 12, further comprising a filter configured to filter the sensor signals.

21. The apparatus of claim 20, wherein the filter comprises a recursive filter.

22. The apparatus of claim 20, wherein the filter comprises a Kalman filter.

23. The apparatus of claim 12, further comprising a control unit configured to control longitudinal movement of the elongated web based on the longitudinal position.

24. The apparatus of claim 12, further comprising a control unit configured to control longitudinal movement of the elongated web based on the longitudinal position.

25. The apparatus of claim 12, wherein the position detector is further configured to compensate for lateral web position shifts in determining the longitudinal position.

26. The apparatus of claim 12, further comprising:
   a lateral position sensor configured to sense a lateral position reference; and
   a lateral position detector configured to determine a lateral web position based on the lateral position reference.

27. The apparatus of claim 26, further comprising a control unit configured to control lateral and longitudinal movement of the elongated web based on the lateral position and the longitudinal position of the elongated web, respectively.

28. The apparatus of claim 12, wherein the fiducial marks comprise printed marks on the web.

29. The apparatus of claim 12, wherein the fiducial marks comprise laser ablated marks on the web.

30. The apparatus of claim 12, wherein the fiducial marks comprise cuts or voids in the web.

31. The apparatus of claim 12, wherein the fiducial marks are embossed, cast or coated on the web.

32. The method of claim 1 wherein the sine fiducial mark and the cosine fiducial mark are deposited by printing on the web.

* * * * *

UNITED STATES PATENT AND TRADEMARK OFFICE
CERTIFICATE OF CORRECTION

PATENT NO. : 9,440,812 B2  
APPLICATION NO. : 12/522493  
DATED : September 13, 2016  
INVENTOR(S) : Daniel Carlson Page 1 of 1

It is certified that error appears in the above-identified patent and that said Letters Patent is hereby corrected as shown below:

In the Specification

Column 5
Lines 17-20, Delete "The marks may be made or applied to the web by contact direct printing, ink jet printing, laser printing, laser marking, ablation, microreplication, scribing, embossing, casting, coating and/or other methods." and insert the same on Column 1, Line 16 as the continuation of the same paragraph.

In the Claims

Column 8
Line 40, In Claim 4, delete "site" and insert -- sine --, therefor.

Signed and Sealed this
Twenty-first Day of February, 2017

Michelle K. Lee
*Director of the United States Patent and Trademark Office*